US012684728B2

(12) United States Patent
Lien et al.

(10) Patent No.: US 12,684,728 B2
(45) Date of Patent: Jul. 14, 2026

(54) POSITIONER AND SERVER

(71) Applicant: Fulian Precision Electronics (Tianjin) Co., LTD., Tianjin (CN)

(72) Inventors: Hsiang-Yu Lien, New Taipei (TW); Cheng-Feng Tsai, New Taipei (TW); Wei-Ting Liao, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 90 days.

(21) Appl. No.: 18/963,634

(22) Filed: Nov. 28, 2024

(65) Prior Publication Data

US 2025/0365882 A1 Nov. 27, 2025

(30) Foreign Application Priority Data

May 22, 2024 (CN) .......................... 202410638472.3

(51) Int. Cl.
H05K 7/14 (2006.01)
G06F 1/185 (2026.01)

(52) U.S. Cl.
CPC .......... H05K 7/1489 (2013.01); G06F 1/185 (2013.01); H05K 7/1402 (2013.01); H05K 7/1404 (2013.01); H05K 7/1405 (2013.01)

(58) Field of Classification Search
CPC .. H05K 7/1402; H05K 7/1404; H05K 7/1405; H05K 7/1409; H05K 7/1417; G06F 1/185; G06F 1/186
See application file for complete search history.

(56) References Cited

U.S. PATENT DOCUMENTS

| | | | |
|---|---|---|---|
| 6,173,843 B1 * | 1/2001 | Christensen ............ | G06F 1/184 |
| | | | 361/801 |
| 8,472,210 B2 * | 6/2013 | Chiu ........................ | G06F 1/186 |
| | | | 361/752 |
| 10,973,157 B2 * | 4/2021 | Elsasser ................ | H05K 9/0062 |
| 11,853,124 B2 * | 12/2023 | Lyu .......................... | G06F 1/185 |
| 2011/0069443 A1 * | 3/2011 | Williams ............. | H01R 12/724 |
| | | | 439/700 |
| 2012/0147557 A1 * | 6/2012 | Chen ........................ | G06F 1/187 |
| | | | 361/679.58 |
| 2016/0286678 A1 * | 9/2016 | Venugopal .......... | G06F 13/4068 |

FOREIGN PATENT DOCUMENTS

| | | |
|---|---|---|
| TW | M542798 U | 6/2017 |
| TW | 202029869 A | 8/2020 |

* cited by examiner

*Primary Examiner* — Adrian S Wilson
(74) *Attorney, Agent, or Firm* — ScienBiziP, P.C.

(57) ABSTRACT

A positioner configured for positioning an expansion card on a server comprises a base, a first moving piece, a first spring, a second moving piece, and a second spring. When the first moving piece is at the reset position, the first moving piece pushes the expansion card in the first direction against the server. The second moving piece at the lower position and the first moving piece at the reset position cooperatively clamp the expansion card in the second direction. The first moving piece at the retreat position or at the buckled position is detached from the expansion card. The first moving piece at the buckled position is buckled by the second moving piece at the lower position. The second moving piece pressed by the expansion card moves from the upper position to the lower position. A server with the positioner is also disclosed.

20 Claims, 9 Drawing Sheets

1000

100

100

POSITIONER AND SERVER

FIELD

The disclosure herein generally relates to information computing systems, and more particularly relates to a positioner and a server.

BACKGROUND

An expansion card such as PCIe card is connected to a connector in a server, usually users need to manually lock and remove the expansion card, which makes it inconvenient to remove and install the expansion card, and sometimes users may forget to lock the expansion card, resulting in the expansion card not being correctly positioned.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
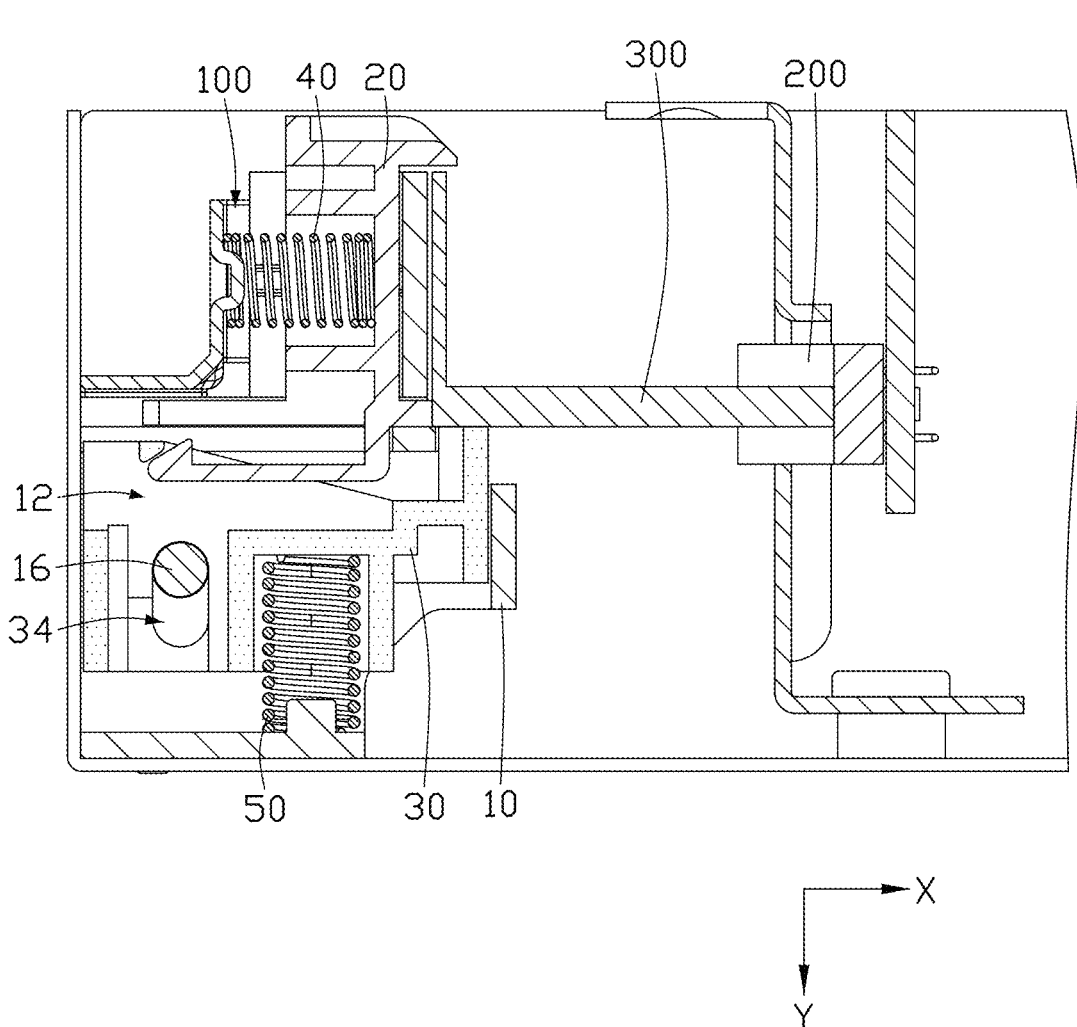
FIG. 1 is a cross-section view of an embodiment of a positioner in a server according to the present disclosure, showing the positioner positioning an expansion card.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to;" it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 2:
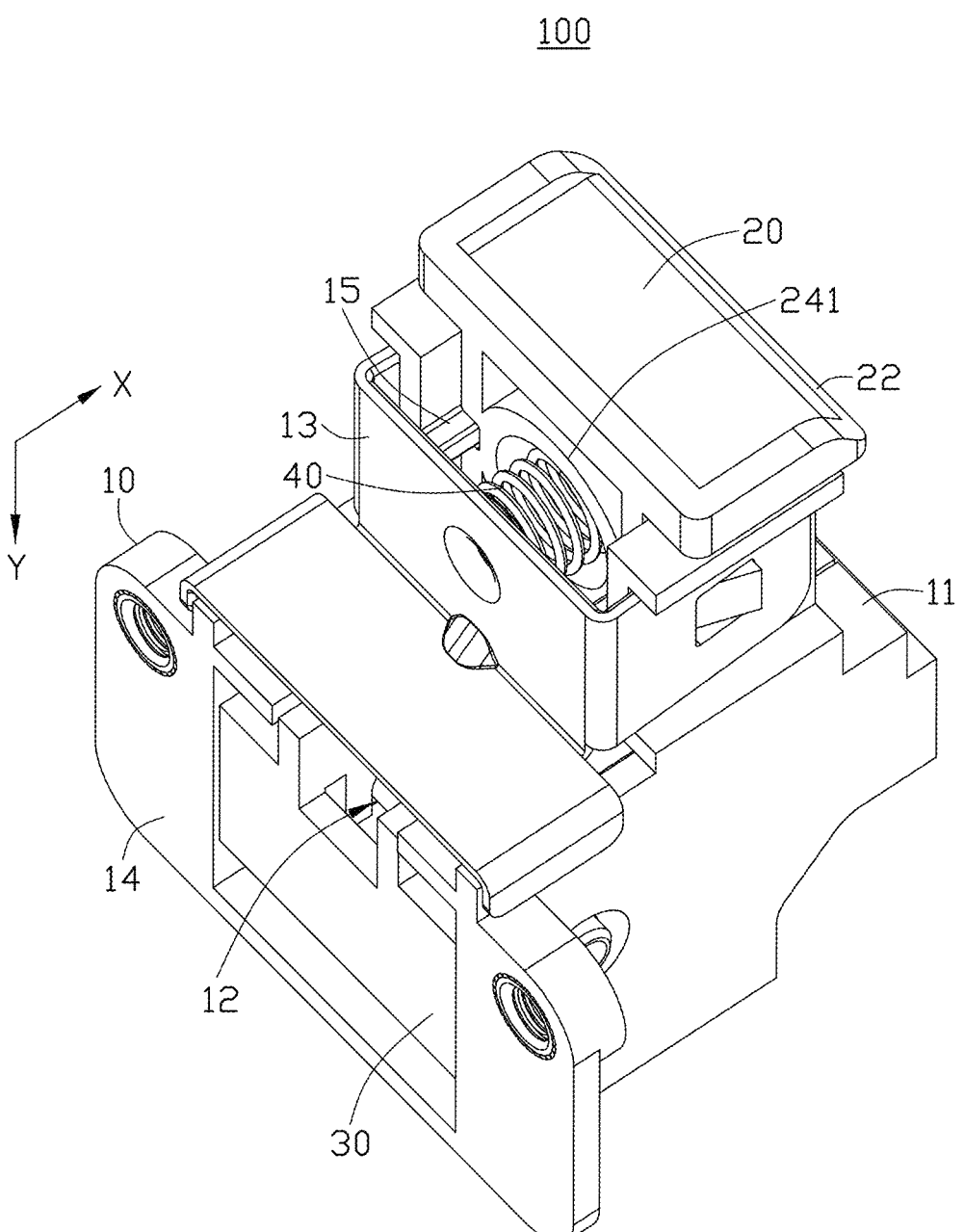
FIG. 2 is an isometric view of the positioner in FIG. 1, showing the positioner in an initial state.

As shown in FIG. 1 and FIG. 2, a server 1000 in an embodiment includes a positioner 100 and a connector 200, the positioner 100 is used to position an expansion card 300, so that the expansion card 300 is connected to the connector 200.

In some embodiments, the expansion card 300 is a PCIe card (peripheral component interconnect express card). The positioner 100 and the connector 200 are located on opposite side of the expansion card 300. The expansion card 300 can be removed from the positioner 100, and the positioner 100 can lock the expansion card 300 automatically when installing the expansion card 300.

Figure 3:
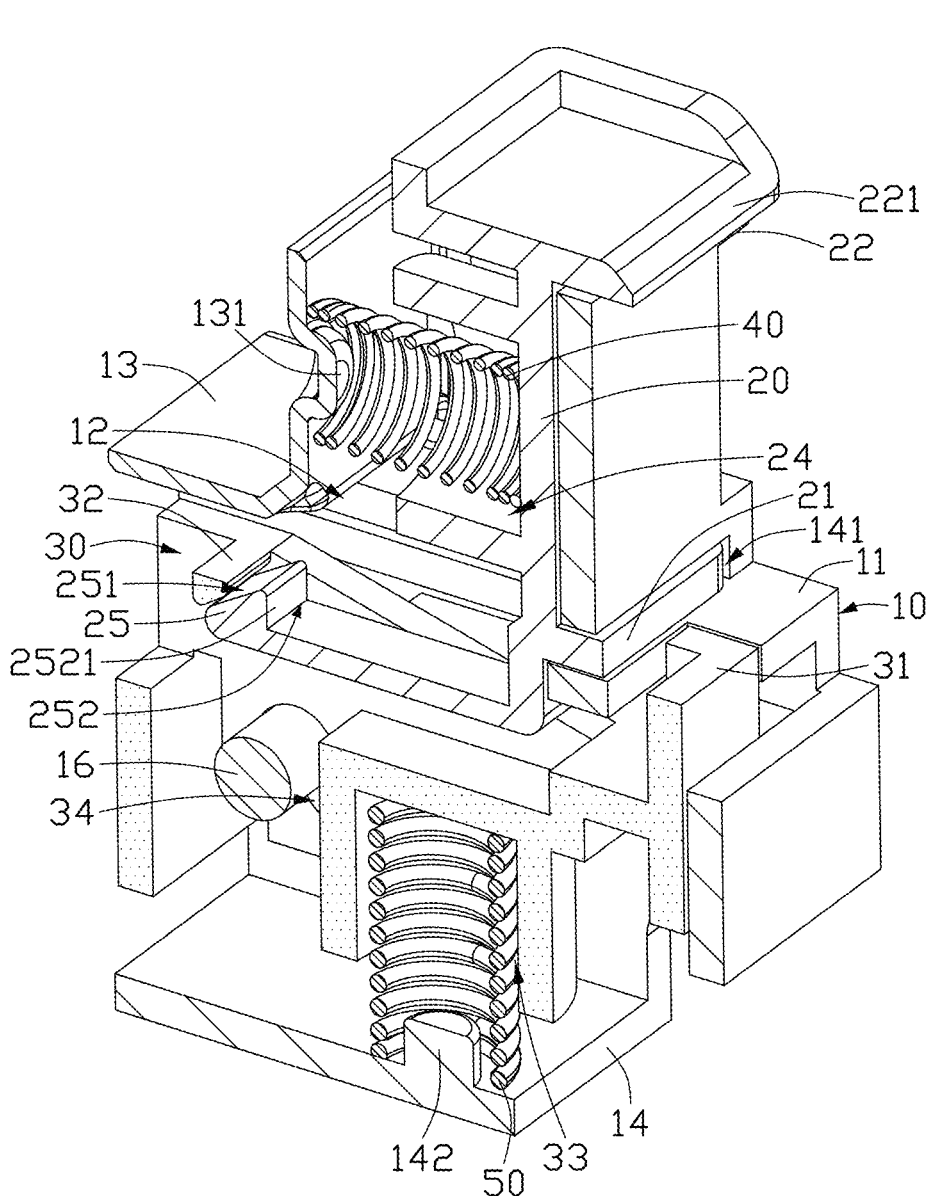
FIG. 3 is an isometric cross-section view of the positioner in FIG. 2, showing the positioner in the initial state.
Figure 4:
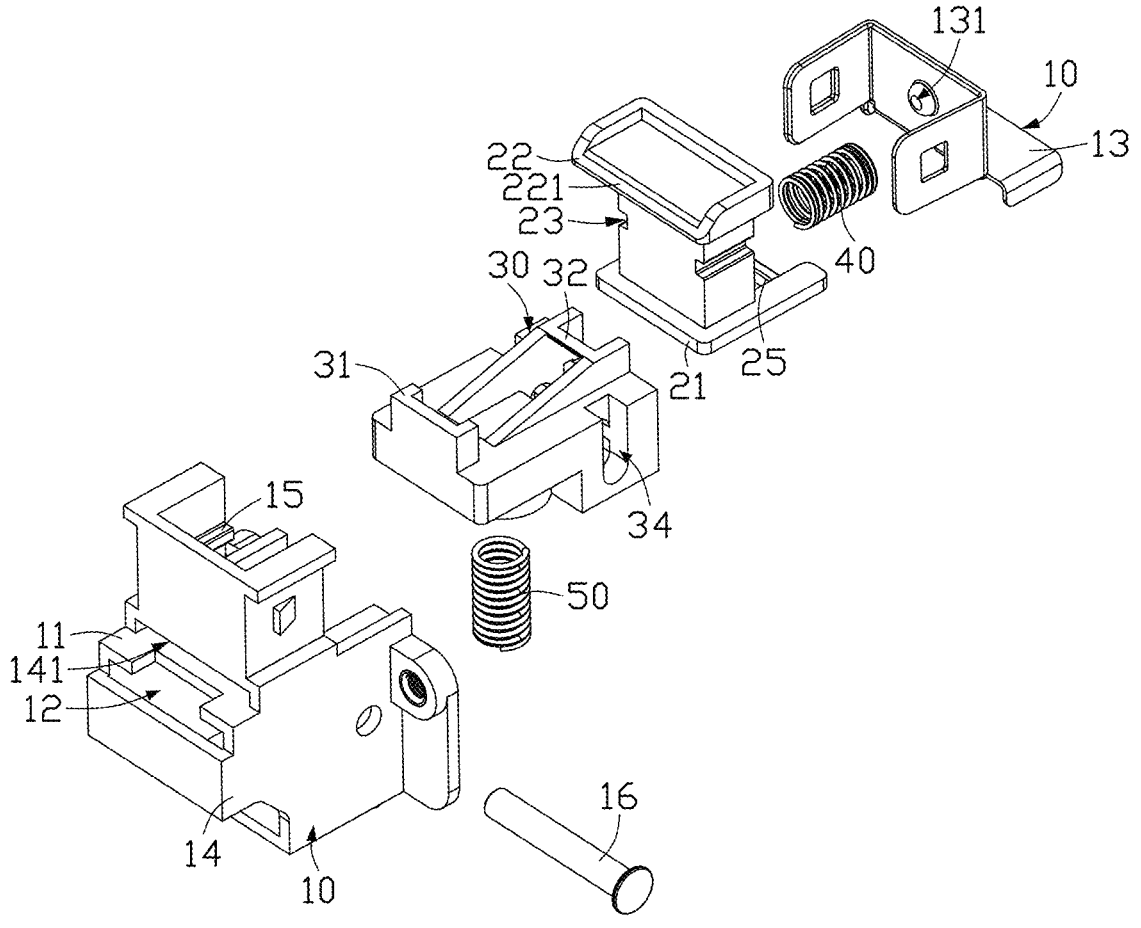
FIG. 4 is an exploded view of the positioner in FIG. 2.

As shown in FIG. 2 to FIG. 4, in some embodiments, the positioner 100 includes a base 10, a first moving piece 20, a second moving piece 30, a first spring 40, and a second spring 50, the base 10 has a supporting surface 11, and the supporting surface 11 is used to support the installed expansion card 300.

Figure 5:
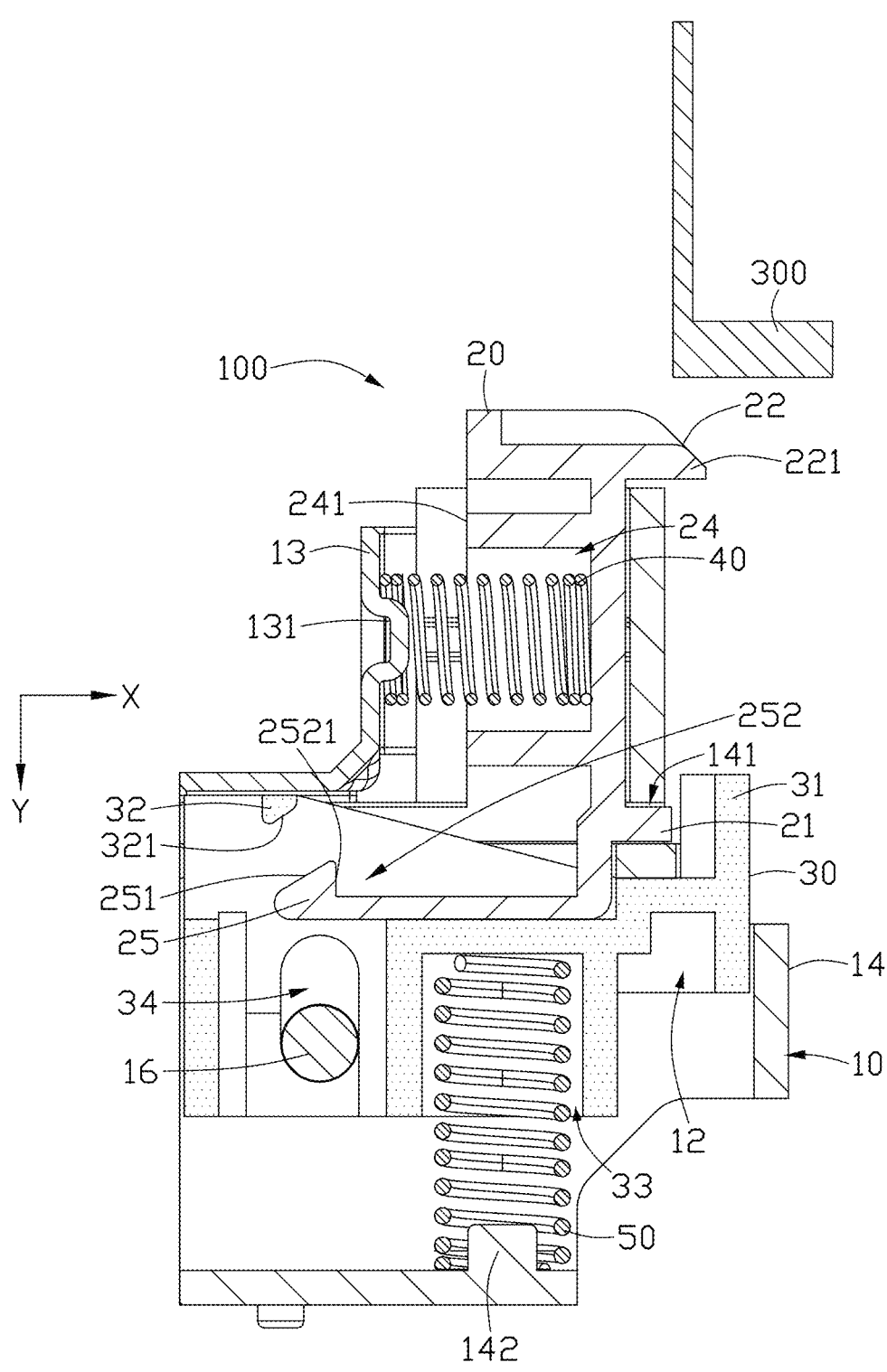
FIG. 5 is a cross-section view of the positioner in FIG. 3, showing the positioner in the initial state.
Figure 6:
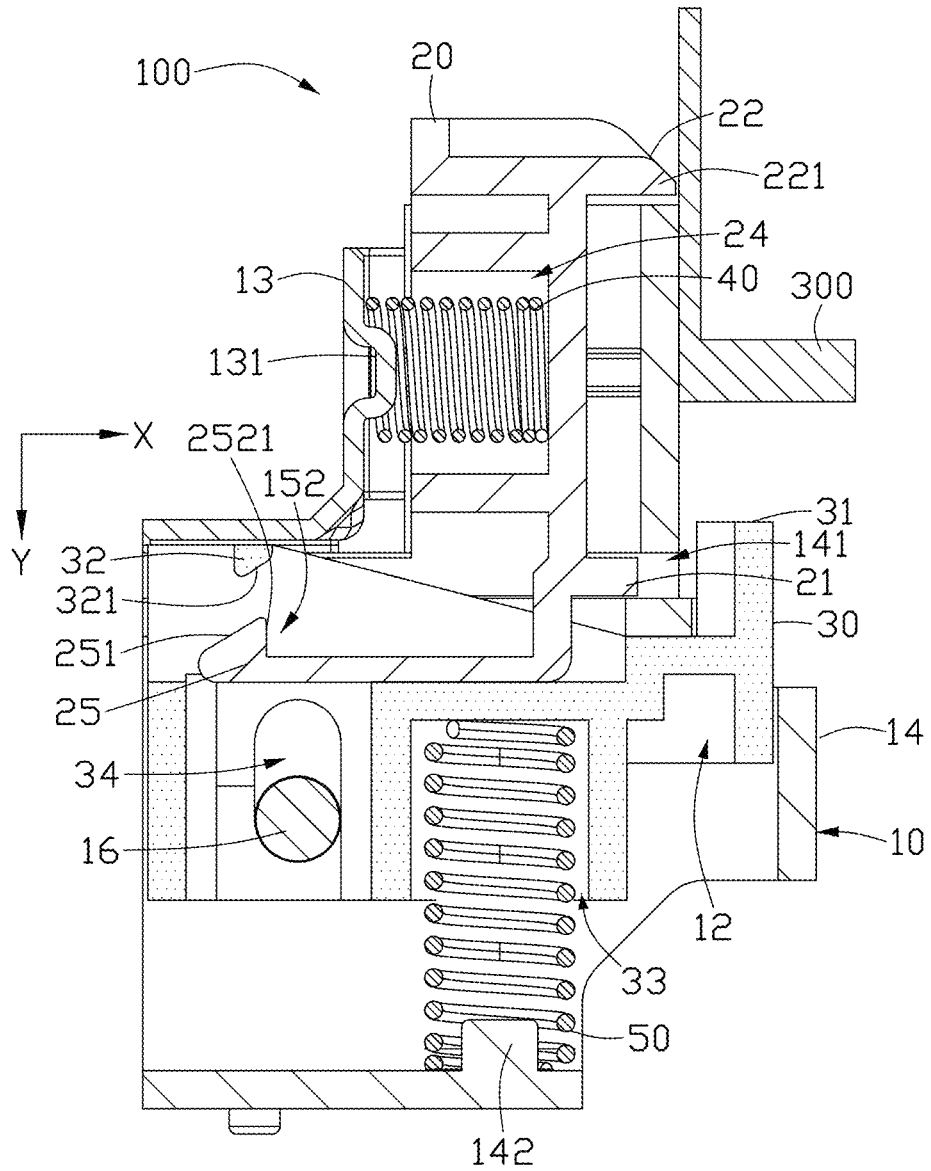
FIG. 6 is a cross-section view of the positioner in FIG. 5, showing a first moving piece at a retreat position and a second moving piece at an upper position.
Figure 7:
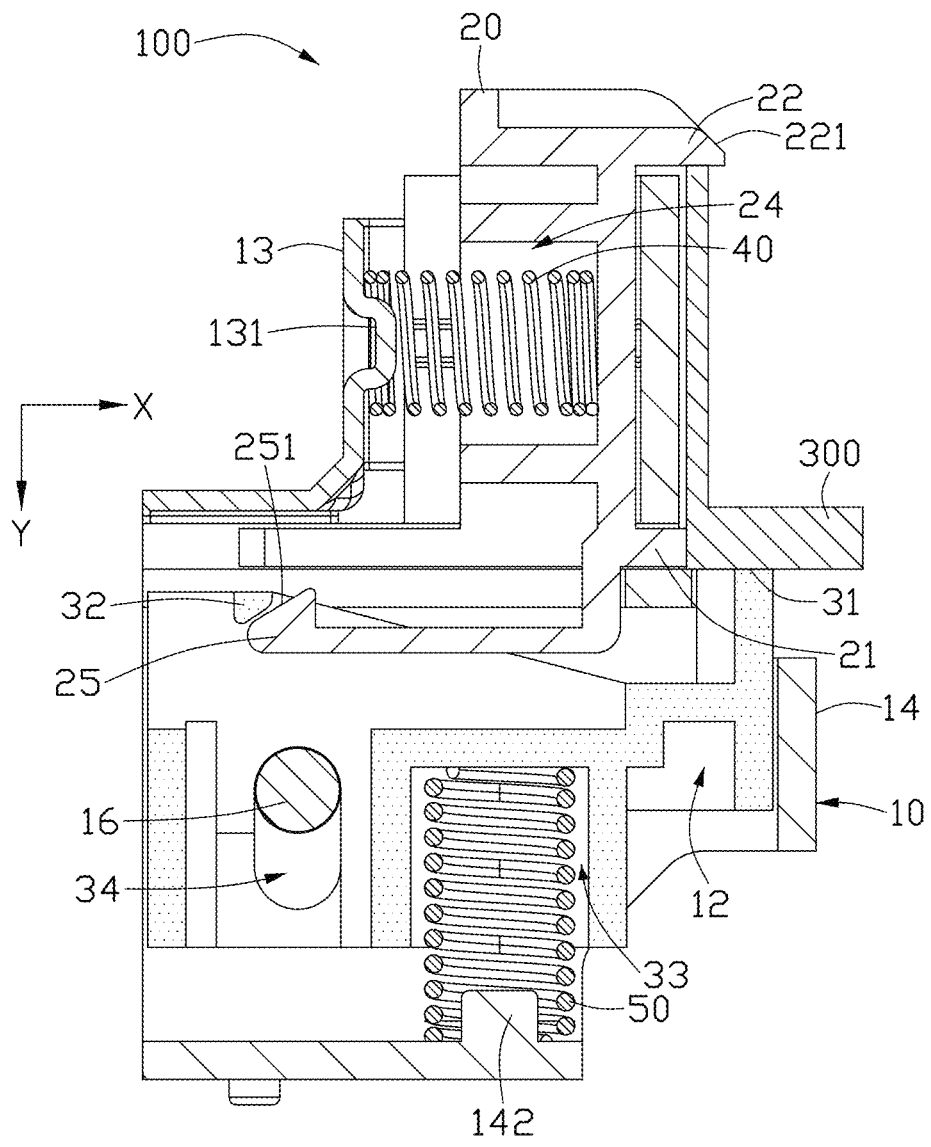
FIG. 7 is a cross-section view of the positioner in FIG. 6, showing the first moving piece at a reset position and the second moving piece at a lower position.
Figure 8:
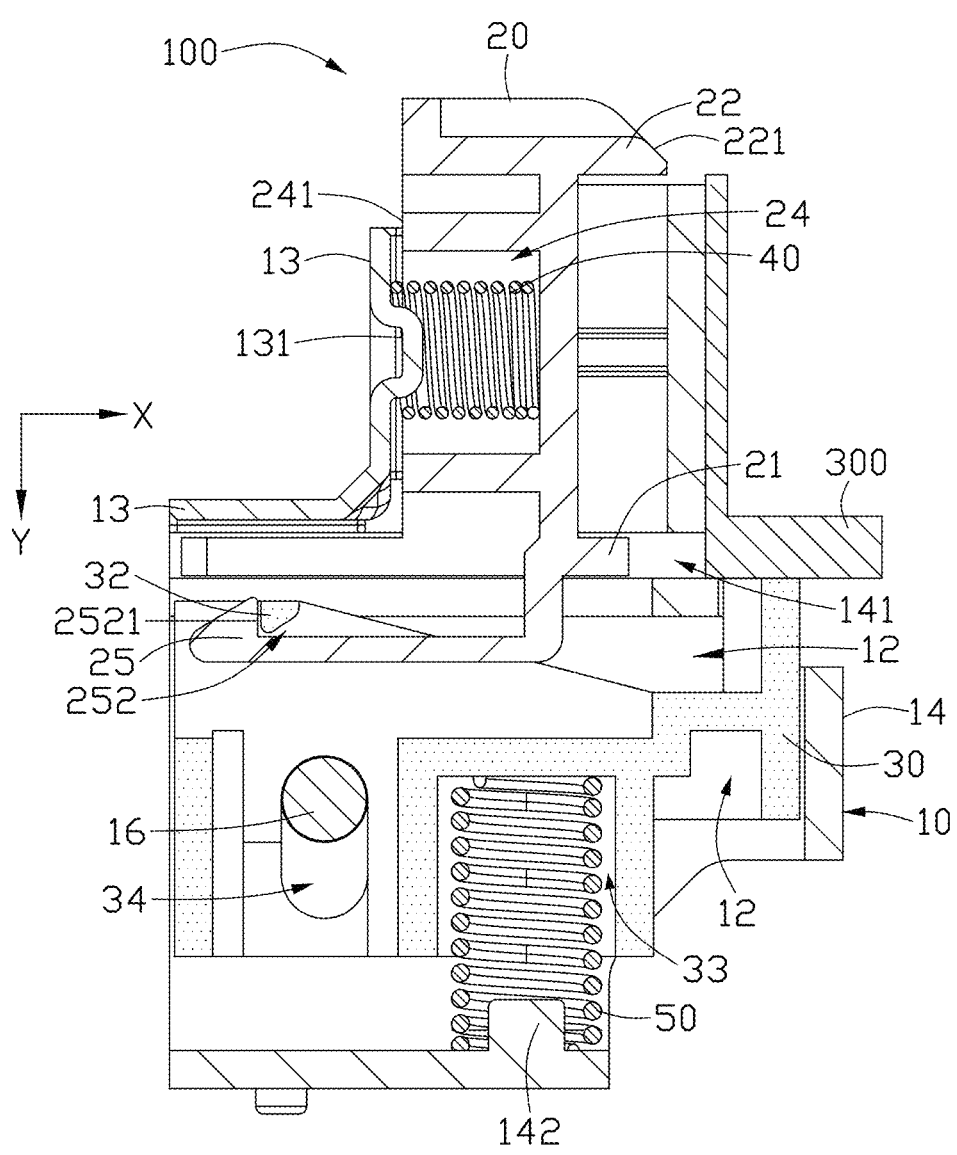
FIG. 8 is a cross-section view of the positioner in FIG. 7, showing the first moving piece at a buckled position and the second moving piece at the lower position.

As shown in FIG. 4 to FIG. 8, the first moving piece 20 is located on the base 10, the first moving piece 20 is movable between a reset position, a retreat position, and a buckled position in a first direction X, the retreat position is between the buckled position and the reset position. The second moving piece 30 is movable between a lower position and an upper position. When the first moving piece 20 is at the reset position, the first moving piece 20 pushes the expansion card 300 in the first direction X, so that the expansion card 300 is pushed against the connector 200; when the first moving piece 20 moves to the retreat position and the buckled position, the first moving piece 20 is detached from the expansion card 300, so that the expansion card 300 is removable. The first moving piece 20 in FIG. 2, FIG. 3, FIG. 5, and FIG. 7 is at the reset position, the first moving piece 20 in FIG. 6 is at the retreat position, the first moving piece 20 in FIG. 8 is at the buckled position.

The first spring 40 is located between the base 10 and the first moving piece 20, the first spring 40 is used to push the first moving piece 20 to the reset position. the second spring 50 is located between the base 10 and the second moving piece 30, the second spring 50 is used to push the second moving piece 30 to the upper position.

As shown in FIG. 3 and FIG. 4, the base 10 has a cavity 12, the first moving piece 20 and the second moving piece 30 are partially placed in the cavity 12. The first moving piece 20 includes a lower protrusion 21 and an upper protrusion 22, when the first moving piece 20 is at the reset position, the lower protrusion 21 extends out of the cavity 12 and pushes expansion card 300 in the first direction X; the upper protrusion 22 is outside the cavity 12 and is used to press the expansion card 300 in the second direction Y, the second direction Y is perpendicular to the first direction X. As shown in FIG. 6 and FIG. 8, when the first moving piece 20 is at the retreat position and the buckled position, the lower protrusion 21 is almost retracted in the cavity 12, and the upper protrusion 22 cannot contact to the expansion card 300.

When the expansion card 300 is installed, the lower protrusion 21 pushes the expansion card 300 in the first direction X, the upper protrusion 22 is above the expansion card 300 and presses the expansion card 300 in the second direction Y.

As shown in FIG. 3, FIG. 5, FIG. 6, and FIG. 7, the upper protrusion 22 has a guiding bevel 221, when the expansion card 300 moves in the second direction Y to be installed, the expansion card 300 slides along the guiding bevel 221 and presses the guiding bevel 221, so that the first moving piece 20 is pushed to move to the retreat position, and the first spring 40 is compressed simultaneously, as shown in FIG. 6, thus, the upper protrusion 22 can let the expansion card 300 continue move down to the supporting surface 11, until the expansion card 300 touches the supporting surface 11, the expansion card 300 stops. As shown in FIG. 7, when the expansion card 300 touches the supporting surface 11, the expansion card 300 is fully under the upper protrusion 22, so the upper protrusion 22 can be reset by the first spring 40 to the reset position; the upper protrusion 22 at the reset position is on a top of the expansion card 300, so the upper protrusion 22 can limit the expansion card 300 from moving up, thereby positioning the expansion card 300 to the supporting surface 11, meanwhile the lower protrusion 21 at the reset position pushes the expansion card 300 against the connector 200, thereby connecting the expansion card 300 to the connector 200.

As shown in FIG. 2 and FIG. 4, the base 10 includes a sheet 13 and a main body 14, the sheet 13 and the main body 14 are assembled. The supporting surface 11 is on the main body 14.

As shown in FIG. 2 and FIG. 4, the base 10 has a rib 15, the first moving piece 20 has a rail groove 23, the rib 15 and the rail groove 23 extends along the first direction X, the rib 15 is inserted into the rail groove 23 and slidable in the rail groove 23, for guiding the first moving piece 20 to move in the first direction X relative to the base 10.

As shown in FIG. 3, the main body 14 further has a hole 141, the hole 141 extends in the first direction X, and the lower protrusion 21 extends out of the cavity 12 through the hole 141.

The first spring 40 is located between the sheet 13 and the first moving piece 20. As shown in FIG. 3, the first moving piece 20 has a first spring slot 24, the first spring 40 is inserted into the first spring slot 24, for holding the first spring 40 on the first moving piece 20. The sheet 13 has a first bump 131, the first bump 131 is inserted into the first spring 40, for holding the first spring 40 on the sheet 13.

As shown in FIG. 3 and FIG. 8, when the first moving piece 20 is at the buckled position, an end-surface 241 of the first spring slot 24 is against the sheet 13, to stop the first moving piece 20.

As shown in FIG. 5 to FIG. 8, when the second moving piece 30 is at the lower position, the second moving piece 30 and the upper protrusion 22 cooperatively clamps the expansion card 300, so that the expansion card 300 is locked in the second direction Y; when the expansion card 300 is removed and the second moving piece 30 is reset, the second moving piece 30 is at the upper position. The second moving piece

30 in FIG. 5 and FIG. 6 is at the upper position, The second moving piece 30 in FIG. 7 and FIG. 8 is at the lower position.

As shown in FIG. 3, and FIG. 5 to FIG. 8, the second moving piece 30 has a clamping surface 31. When the expansion card 300 is installed, the expansion card 300 pushes the clamping surface 31 to the lower position. When the second moving piece 30 is at the lower position, the clamping surface 31 and the supporting surface 11 are co-planar, to support the expansion card 300 together.

Figure 9:
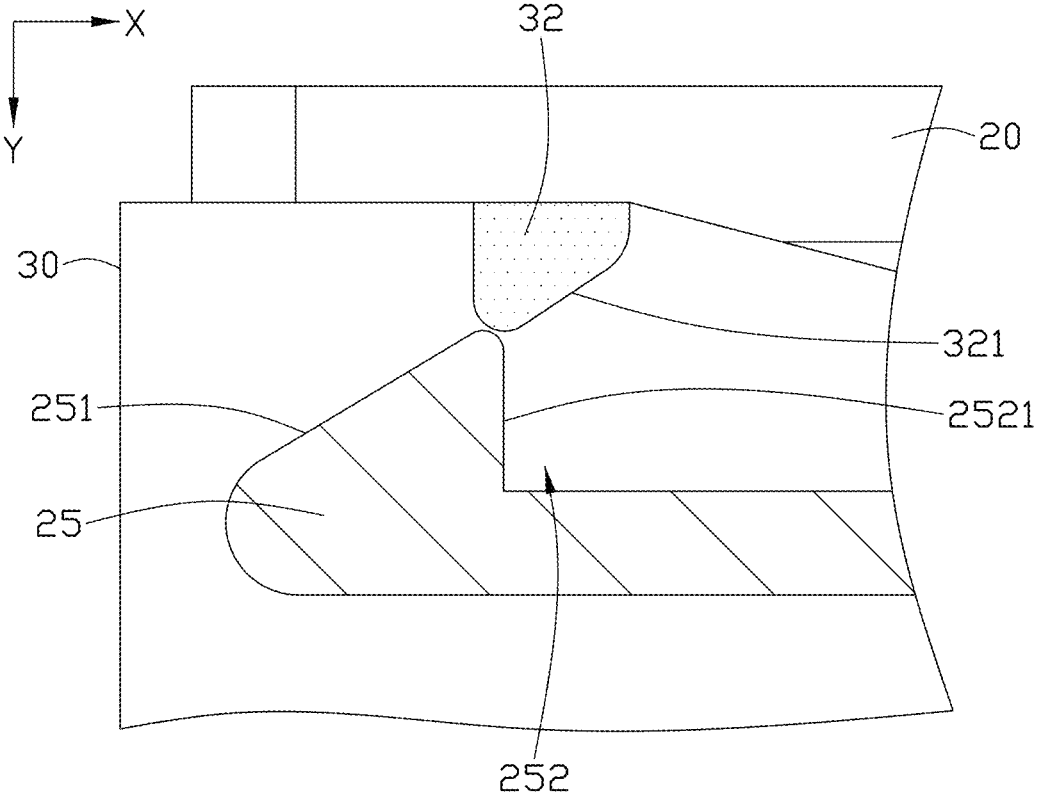
FIG. 9 is a cross-section view of a buckle and a beam of the positioner in FIG. 3.

As shown in FIG. 3, FIG. 5, to FIG. 9, the first moving piece 20 includes a buckle 25, the second moving piece 30 includes a beam 32, when the first moving piece 20 is at the buckled position, the buckle 25 hooks the beam 32, as shown from FIG. 7 to FIG. 8, so that the first moving piece 20 is blocked from moving to the reset position. When the second moving piece 30 moves to the upper position, the beam 32 moves up and leaves the buckle 25, so the buckle 25 is released and the first moving piece 20 will be pushed by the first spring 40 to the reset position, as shown from FIG. 8 to FIG. 5. When the first moving piece 20 is at the buckled position, the second moving piece 30 is at the lower position, the beam 32 blocks the buckle 25 from moving to the reset position; when the second moving piece 30 moves from the lower position to the upper position, the beam 32 releases the buckle 25.

As shown in FIG. 3, FIG. 5 to FIG. 9, the buckle 25 has an upward bevel 251 and a slot space 252 behind the upward bevel 251, the beam 32 has a downward bevel 321, the downward bevel 321 and the upward bevel 251 are parallel. When the first moving piece 20 moves to the buckled position, the upward bevel 251 slides along the downward bevel 321 and pushes the downward bevel 321, simultaneously the buckle 25 deforms, until the beam 32 is above the slot space 252, the buckle 25 reset elastically, and the beam 32 goes into the slot space 252, so that the beam 32 blocks the buckle 25 from moving to the reset position. When the second moving piece 30 moves from the lower position to the upper position, the beam 32 moves out of the slot space 252 to release the buckle 25.

As shown in FIG. 3, and FIG. 5 to FIG. 8, the second moving piece 30 has a second spring slot 33, the second spring slot 33 extends in the second direction Y, the second spring 50 is inserted in the second spring slot 33, for positioning the second spring 50 on the second moving piece 30. As shown in FIG. 3, the main body 14 has a second bump 142, the second bump 142 is inserted into the second spring 50, for positioning the second spring 50 on the main body 14.

As shown in FIG. 3 and FIG. 4, in some embodiments, the base 10 has guiding pin 16, the second moving piece 30 has a guiding groove 34, the guiding groove 34 extends in the second direction Y, the guiding pin 16 is inserted into the guiding groove 34 and is slidable in the guiding groove 34, for guiding the second moving piece 30 to move in the second direction Y.

As shown in FIG. 1, and FIG. 5 to FIG. 9, the positioner 100 has an initial state and a lock state. The positioner 100 in FIG. 5 is at the initial state, in the initial state, the expansion card 300 is removed from the server 1000, the first moving piece 20 is at the reset position, and the second moving piece 30 is at the upper position. The positioner 100 in FIG. 1 and FIG. 7 is at the lock state, in the lock state, the expansion card 300 is installed in the server 1000, and the expansion card 300 is connected to the connector 200 and is positioned by the positioner 100.

As shown in FIG. 5, FIG. 6, and FIG. 7, when installing the expansion card 300, users need to press the expansion card 300 down in the second direction Y; when expansion card 300 pushes the guiding bevel 221 of upper protrusion 22, the first moving piece 20 moves to the retreat position. When the expansion card 300 touches the clamping surface 31 of the second moving piece 30 at the upper position, the second moving piece 30 moves down, until the expansion card 300 touches the supporting surface 11, it means the expansion card 300 is fully under the upper protrusion 22, so the first moving piece 20 will move to the reset position pushed by the first spring 40, and meanwhile the lower protrusion 21 pushes the expansion card 300 against the connector, and the upper protrusion 22 press expansion card 300 to the clamping surface 31, at this moment, the second moving piece 30 is at the lower position, and the positioner 100 is in the lock state.

As shown in FIG. 7, FIG. 8, and FIG. 5, when removing the expansion card 300, users need to pull the first moving piece 20 to the buckled position by hand; when the first moving piece 20 is at the buckled position, the buckle 25 hooks the beam 32 to lock the first moving piece 20 on the buckled position, at this moment, the lower protrusion 21 and the upper protrusion 22 leaves the expansion card 300, so the expansion card 300 can be removed; during users removes the expansion card 300, as shown in FIG. 8, FIG. 6, and FIG. 5, the expansion card 300 moves up, the clamping surface 31 is no longer pressed by the expansion card 300, so the second moving piece 30 moves to the upper position by the second spring 50. During the second moving piece 30 moves to the upper position, the beam 32 leaves the buckle 25, so the first moving piece 20 can move to the reset position by the first spring 40. During the first moving piece 20 moves to the reset position, the first moving piece 20 will stop at the retreat position for a while, because the upper protrusion 22 is blocked by the expansion card 300 during the expansion card 300 is pulled out, until the expansion card 300 is fully pulled out of the positioner 100, the first moving piece 20 is no longer be blocked by the expansion card 300, so the first moving piece 20 continue to move to the reset position by the first spring 40, which means the positioner 100 is in the initial state.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A positioner configured for positioning an expansion card on a server, the positioner comprising:
   a base;
   a first moving piece movable relative to the base in a first direction between a reset position, a retreat position, and a buckled position;
   a first spring located in the base and configured to push the first moving piece towards the reset position;
   a second moving piece movable relative to the base in a second direction between a lower position and an upper position, the second direction substantially perpendicular to the first direction; and
   a second spring located in the base and configured to push the second moving piece towards the upper position,

wherein when the first moving piece is at the reset position, the first moving piece pushes the expansion card in the first direction against the server; when the second moving piece is at the lower position and the first moving piece is at the reset position, the second moving piece and the first moving piece cooperatively clamp the expansion card in the second direction; when the first moving piece is at the retreat position or at the buckled position, the first moving piece is detached from the expansion card; when the first moving piece is at the buckled position and buckled by the second moving piece at the lower position, the second moving piece is pressed by the expansion card and the second moving piece moves from the upper position to the lower position.

2. The positioner of claim 1, wherein the first moving piece comprises a buckle, the second moving piece comprises a beam; when the first moving piece is at the buckled position and the second moving piece is at the lower position, the buckle hooks the beam thereby stopping the first moving piece from moving to the reset position; when the second moving piece moves to the upper position from the lower position, the beam is released from the buckle, so that the first moving piece can move to the reset position.

3. The positioner of claim 2, wherein the buckle comprises an upward bevel and a slot space behind the upward bevel, the beam comprises a downward bevel; when the second moving piece is at the lower position and the first moving piece moves to the buckled position, the upward bevel silds along the downward bevel and the buckle deforms, until the beam is above the slot space, the buckle resets to insert the beam into the slot space, so that the buckle hooks the beam thereby stopping the first moving piece from moving to the reset position; when the second moving piece moves to the upper position from the lower position, the beam moves out of the slot space, so that the first moving piece can move to the reset position.

4. The positioner of claim 3, wherein the buckle further comprises a plane in the slot space; when the buckle hooks the beam, the plane is against the beam to stop the first moving piece from moving to the reset position.

5. The positioner of claim 1, wherein the first moving piece comprises a lower protrusion, the base further comprises a first guiding hole, the lower protrusion extends through the first guiding hole in the first direction; when the first moving piece is at the reset position, the lower protrusion is outstretched and pushes the expansion card against the server; when the first moving piece moves to the buckled position, the lower protrusion is retracted to release the expansion card.

6. The positioner of claim 5, wherein the first moving piece further comprises an upper protrusion, and the upper protrusion comprises a guiding bevel on a front-top of the upper protrusion; when the expansion card is moved in the second direction to be positioned by the base, the guiding bevel guides the expansion card to slide along the guiding bevel and the guiding bevel is pressed by the expansion card, so that the first moving piece is moved to the retreat position from the reset position, and the first moving piece is stopped, by the expansion card, from moving to the reset position until the expansion card is further moved to be under the upper protrusion; when the expansion card is under the upper protrusion, the first spring pushes the first moving piece to the reset position, the upper protrusion and the second moving piece at the lower position cooperatively clamp the expansion card; and when the first moving piece moves to the buckled position, the upper protrusion releases the expansion card so that the expansion card can be removed from the base.

7. The positioner of claim 6, wherein the base comprises a main body and a sheet, the main body comprises a supporting surface, the second moving piece further comprises a clamping surface, when the second moving piece is at the lower position, the clamping surface and the supporting surface are co-planar, the clamping surface is configured for clamping the expansion card with the upper protrusion, the supporting surface is configured for supporting the expansion card clamped by the clamping surface and the upper protrusion, the sheet comprises a first bump, the first bump extends in the first direction and is inserted into the first spring to position the first spring, the main body comprises a second bump, the second bump extends in the second direction and is inserted into the second spring to position the second spring.

8. The positioner of claim 7, wherein the main body further comprises a guiding pin, the second moving piece comprises a guiding groove, the guiding pin extends through the guiding groove and is slidable in the guiding groove, the guiding pin guides the second moving piece to move in the second direction.

9. The positioner of claim 7, wherein the main body further comprises a rib, the first moving piece further comprises a rail groove, the rib and the rail groove extend in the first direction, the rib is inserted into the rail groove and is slidable in the rail groove in the first direction, the rib guides the first moving piece to move in the first direction.

10. The positioner of claim 7, wherein the first moving piece comprises a first spring slot, the first spring is inserted into the first spring slot, when the first moving piece is at the buckled position, an end-surface of the first spring slot is against the sheet, the second moving piece comprises a second spring slot, the second spring is inserted into the second spring slot.

11. A server comprising:
a connector; and
a positioner configured for positioning an expansion card to the connector, the positioner comprising:
    a base;
    a first moving piece movable relative to the base in a first direction between a reset position, a retreat position, and a buckled position;
    a first spring located in the base and configured to push the first moving piece towards the reset position;
    a second moving piece movable relative to the base in a second direction between a lower position and an upper position, the second direction substantially perpendicular to the first direction; and
    a second spring located in the base and configured to push the second moving piece towards the upper position,
    wherein when the first moving piece is at the reset position, the first moving piece pushes the expansion card to the connector; when the second moving piece is at the lower position and the first moving piece is at the reset position, the second moving piece and the first moving piece cooperatively clamp the expansion card in the second direction; when the first moving piece is at the retreat position or at the buckled position, the first moving piece is detached from the expansion card; when the first moving piece is at the buckled position and buckled by the second moving piece at the lower position, the second moving piece is pressed by the expansion card and the second moving piece moves from the upper position to the lower position.

12. The server of claim 11, wherein the first moving piece comprises a buckle, the second moving piece comprises a beam; when the first moving piece is at the buckled position and the second moving piece is at the lower position, the buckle hooks the beam thereby stopping the first moving piece from moving to the reset position; when the second moving piece moves to the upper position from the lower position, the beam is released from the buckle, so that the first moving piece can move to the reset position.

13. The server of claim 12, wherein the buckle comprises an upward bevel and a slot space behind the upward bevel, the beam comprises a downward bevel; when the second moving piece is at the lower position and the first moving piece moves to the buckled position, the upward bevel silds along the downward bevel and the buckle deforms, until the beam is above the slot space, the buckle resets to insert the beam into the slot space, so that the buckle hooks the beam thereby stopping the first moving piece from moving to the reset position; when the second moving piece moves to the upper position from the lower position, the beam moves out of the slot space, so that the first moving piece can move to the reset position.

14. The server of claim 13, wherein the buckle further comprises a plane in the slot space, when the buckle hooks the beam, the plane is against the beam to stop the first moving piece from moving to the reset position.

15. The server of claim 11, wherein the first moving piece comprises a lower protrusion, the base further comprises a first guiding hole, the lower protrusion extends through the first guiding hole in the first direction; when the first moving piece is at the reset position, the lower protrusion is outstretched and pushes the expansion card against the server; when the first moving piece moves to the buckled position, the lower protrusion is retracted and to release the expansion card.

16. The server of claim 15, wherein the first moving piece further comprises an upper protrusion, and the upper protrusion comprises a guiding bevel on a front-top of the upper protrusion;, when the expansion card is moved in the second direction to be positioned by the base, the guiding bevel guides the expansion card to slide along the guiding bevel and the guiding bevel is pressed by the expansion card, so that the first moving piece is moved to the retreat position from the reset position, and the first moving piece is stopped, by the expansion card, from moving to the reset position until the expansion card is further moved to be under the upper protrusion; when the expansion card is under the upper protrusion, the first spring pushes the first moving piece to the reset position, the upper protrusion and the second moving piece at the lower position cooperatively clamp the expansion card; and when the first moving piece moves to the buckled position, the upper protrusion releases the expansion card so that the expansion card can be removed from the base.

17. The server of claim 16, wherein the base comprises a main body and a sheet, the main body comprises a supporting surface, the second moving piece further comprises a clamping surface, when the second moving piece is at the lower position, the clamping surface and the supporting surface are co-planar, the clamping surface is configured for clamping the expansion card with the upper protrusion, the supporting surface is configured for supporting the expansion card clamped by the clamping surface and the upper protrusion, the sheet comprises a first bump, the first bump extends in the first direction and is inserted into the first spring to position the first spring, the main body comprises a second bump, the second bump extends in the second direction and is inserted into the second spring to position the second spring.

18. The server of claim 17, wherein the main body further comprises a guiding pin, the second moving piece comprises a guiding groove, the guiding pin extends through the guiding groove and is slidable in the guiding groove, the guiding pin guides the second moving piece to move in the second direction.

19. The server of claim 17, wherein the main body further comprises a rib, the first moving piece further comprises a rail groove, the rib and the rail groove extend in the first direction, the rib is inserted into the rail groove and is slidable in the rail groove in the first direction, the rib guides the first moving piece to move in the first direction.

20. The server of claim 17, wherein the first moving piece comprises a first spring slot, the first spring is inserted into the first spring slot, when the first moving piece is at the buckled position, an end-surface of the first spring slot is against the sheet, the second moving piece comprises a second spring slot, the second spring is inserted into the second spring slot.

\* \* \* \* \*